United States Patent
Steiner et al.

(10) Patent No.: US 11,024,391 B1
(45) Date of Patent: Jun. 1, 2021

(54) SYSTEM AND METHOD FOR ESTIMATING UNINFORMED LOG-LIKELIHOOD RATIO (LLR) FOR NAND FLASH MEMORIES

(71) Applicant: Toshiba Memory Corporation, Tokyo (JP)

(72) Inventors: Avi Steiner, Kiriat Motzkin (IL); Hanan Weingarten, Herzliya (IL)

(73) Assignee: Toshiba Memory Corporation, Tokyo (JP)

( * ) Notice: Subject to any disclaimer, the term of this patent is extended or adjusted under 35 U.S.C. 154(b) by 0 days.

(21) Appl. No.: 16/569,614

(22) Filed: Sep. 12, 2019

(51) Int. Cl.
| | |
|---|---|
| *H03M 13/00* | (2006.01) |
| *G11C 16/26* | (2006.01) |
| *G11C 16/34* | (2006.01) |
| *H03M 13/39* | (2006.01) |
| *G06F 11/10* | (2006.01) |
| *G11C 29/50* | (2006.01) |

(52) U.S. Cl.
CPC .......... *G11C 16/26* (2013.01); *G06F 11/1024* (2013.01); *G11C 16/34* (2013.01); *G11C 29/50004* (2013.01); *H03M 13/3927* (2013.01)

(58) Field of Classification Search
None
See application file for complete search history.

(56) References Cited

U.S. PATENT DOCUMENTS

| | | | | |
|---|---|---|---|---|
| 8,943,386 B1* | 1/2015 | Lee | ....... | G06F 11/076 714/763 |
| 2014/0334228 A1* | 11/2014 | Kim | ....... | G11C 29/52 365/185.03 |
| 2015/0256201 A1* | 9/2015 | Sakurada | ....... | G11C 29/021 714/719 |
| 2016/0124805 A1* | 5/2016 | Lee | ....... | G11C 16/3418 714/6.11 |
| 2019/0286516 A1* | 9/2019 | Jacobvitz | ....... | G11C 11/5642 |
| 2019/0295635 A1* | 9/2019 | Kiyooka | ....... | G11C 11/5642 |
| 2020/0026470 A1* | 1/2020 | Yang | ....... | G11C 16/0483 |

* cited by examiner

*Primary Examiner* — Mujtaba M Chaudry
(74) *Attorney, Agent, or Firm* — Foley & Lardner LLP

(57) ABSTRACT

A flash memory system may include a flash memory and a circuit for performing operations of the flash memory. The circuit may be configured to estimate slope information of a plurality of threshold voltage samples based on a first read operation on the flash memory with a first reference voltage. The circuit may be configured to generate soft information based on the estimated slope information. The circuit may be configured to decode a result of a second read operation on the flash memory based on the soft information.

20 Claims, 7 Drawing Sheets

| Slope Ratio (r) | LLR Values ($L_{HE}$) |
|---|---|
| Default | 0 |
| r > 2400 | 7 |
| elseif r > 2200 | 8 |
| elseif r > 2000 | 9 |
| elseif r > 1800 | 10 |
| elseif r > 1600 | 11 |
| elseif r > 1400 | 12 |
| elseif r > 1100 | 14 |

SYSTEM AND METHOD FOR ESTIMATING UNINFORMED LOG-LIKELIHOOD RATIO (LLR) FOR NAND FLASH MEMORIES

TECHNICAL FIELD

The present embodiments relate generally to system and method for performing operations of a flash memory, and more particularly to system and method for decoding a result of a read operation on a flash memory based on estimated slope information of threshold voltage samples.

BACKGROUND

As the number and types of computing devices continue to expand, so does the demand for memory used by such devices. Memory includes volatile memory (e.g. RAM) and non-volatile memory. One popular type of non-volatile memory is flash memory or NAND-type flash. A NAND flash memory array includes rows and columns (strings) of cells. A cell may include a transistor.

During a read operation, an entire row/page of the NAND flash memory array may be read. This may be done by applying a bias voltage to all rows not being read and a reference voltage to the row that should be read. The bias voltage may allow the transistor of the NAND flash memory array to fully conduct. The cells lying on the row being read will conduct only if the threshold voltage is sufficiently high to overcome the trapped charge in the floating gate. A sense amplifier may be connected to each string which measures the current through the string and outputs either a "1" or a "0" depending whether the current passed a certain threshold.

Due to different stress conditions (e.g., NAND noise and interference sources) during programming and/or read of the NAND flash memory, there may be errors in the programmed and read output. Improvements in decoding capabilities in such a wide span of stress conditions for NAND flash devices remain desired.

SUMMARY

The present embodiments relate to methods for obtaining higher endurance and better resilience to retention and read-disturb stresses by decoding a result of a read operation on a flash memory based on estimated slope information of threshold voltage samples.

According to certain aspects, embodiments provide a method for performing operations of a flash memory. The method may include estimating slope information of a plurality of threshold voltage samples based on a first read operation on the flash memory with a first reference voltage. The method may further include generating soft information based on the estimated slope information. The method may further include decoding a result of a second read operation on the flash memory based on the soft information.

According to other aspects, embodiments provide a flash memory system including a flash memory and a circuit for performing operations of the flash memory. The circuit may be configured to estimate slope information of a plurality of threshold voltage samples based on a first read operation on the flash memory with a first reference voltage. The circuit may be further configured to generate soft information based on the estimated slope information. The circuit may be further configured to decode a result of a second read operation on the flash memory based on the soft information.

BRIEF DESCRIPTION OF THE DRAWINGS

These and other aspects and features of the present embodiments will become apparent to those ordinarily skilled in the art upon review of the following description of specific embodiments in conjunction with the accompanying figures, wherein:

FIG. 4 is a table illustrating an example aspect of mapping of a slopes ratio into an LLR value using example methodologies according to some embodiments;

DETAILED DESCRIPTION

Figure 1:
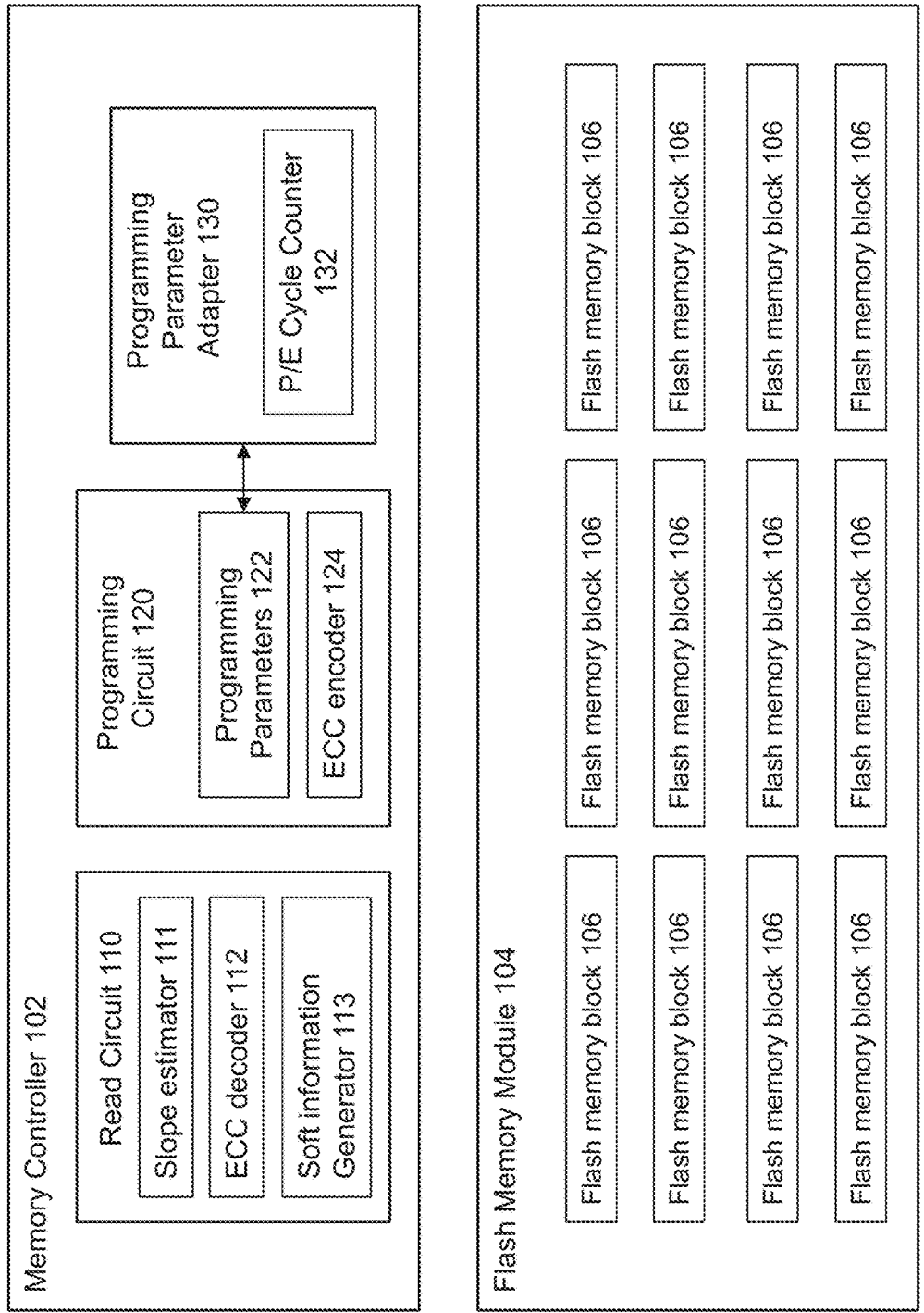
FIG. 1 is a block diagram illustrating an example flash memory system according to some embodiments.

According to certain aspects, embodiments in the present disclosure relate to techniques for decoding a result of a read operation on a flash memory based on estimated slope information of threshold voltage samples so as to obtain higher endurance and better resilience to retention and read-disturb stresses.

Due to different NAND noise and interference sources during programming and/or read of a NAND flash memory, there may be errors in the programmed and read output. Such errors may occur due to programming errors, reading with non-optimal thresholds, retention stresses, or read-disturb stresses, etc. As a result of these noise sources, there may be errors on the information bits that were originally saved to NAND.

A strong error correction code (ECC) can allow for faster programming, with possibly higher programming errors, and read under high stress conditions, and/or with lower complexity digital signal processing (DSP). For efficient utilization of a strong ECC, the ECC can be provided with maximal available information (e.g., soft input) in its different working mode. That is, for soft input, the accuracy of a log-likelihood ratio (LLR) mapping, which is induced by a channel model and sampling, can be very important for soft decoding efficiency.

However, dynamic changes of a NAND memory channel over time or its different usage scenarios may result in different channel distributions as function of its stress conditions. For example, there may be a strong erase penetration which may result in a non-symmetric distribution around a threshold as function of read-disturb stress. Therefore, with these stress conditions, it may be difficult to accurately estimate an LLR mapping (or LLR values).

To solve this problem, according to certain aspects, embodiments in the present disclosure relate to techniques for improving soft decoding efficiency by performing an initial LLR estimation from soft samples to provide a decoder LLR corresponding to estimated NAND channel realization. In some embodiments, an LLR estimation may be performed by online adaptation of soft information. In some embodiments, after soft sampling is performed, estimation of histogram slopes of soft samples may be performed by approximating a Laplace distribution (or other probability density function). In some embodiments, this estimation can be performed for every relevant read threshold (e.g., read thresholds T0-T6 in FIG. 2). In some embodiments, an estimate of hard errors may be computed from a slope ratio from estimated histogram slopes. In some embodiments, LLRs may be mapped according to results of the estimation. In some embodiments, mapping can be performed using a table (e.g., a look up table (LUT) 400 in FIG. 4). In some embodiments, historical values of empirical LLRs from previous pages (or reads of previous pages, of the same codeword, or of neighboring codewords) can be used for refining the estimation result according to their relevance to a target codeword. For example, when there are 4 codewords stored on same page (e.g., with 4 KB codewords written to a 16 KB page), on sequential reads, the information of successfully decoded previous codewords on the same page can be used to compute empirical LLRs. The empirical LLRs can be used as initial conditions for a static LLR estimation for the next codewords. In other words, empirical LLRs can be computed by using actual known error distribution of the neighboring codewords to quantify the observed LLR after the decoding success. Therefore, the second codeword on the page can benefit from this information when the first codeword succeeded, and allow for more accurate estimation of the static LLR, thereby providing a useful feature for sequential reads.

In some embodiments, a page may correspond to a codeword. In some embodiments, page and codeword are not necessarily the same entity. That is, a page may contain several codewords. In some embodiments, e.g. in case of striping, a codeword may be split and written to several pages, on several dies, for example.

Dynamic stress conditions may include read-disturb where a significant erase penetration may be observed, creating a strongly asymmetric histogram slope, and maybe high hard error rate for a soft decoder. According to certain aspects, embodiments in the present disclosure can dynamically estimate the hard error rate from failed decoder information or histogram distribution.

According to certain aspects, embodiments in the present disclosure relate to a method for performing operations of a flash memory. The method may include estimating slope information of a plurality of threshold voltage samples based on a first read operation on the flash memory with a first reference voltage. The method may further include generating soft information based on the estimated slope information. The method may further include decoding a result of a second read operation on the flash memory based on the soft information.

According to certain aspects, embodiments in the present disclosure relate to a flash memory system including a flash memory and a circuit for performing operations of the flash memory. The circuit may be configured to estimate slope information of a plurality of threshold voltage samples based on a first read operation on the flash memory with a first reference voltage. The circuit may be further configured to generate soft information based on the estimated slope information. The circuit may be further configured to decode a result of a second read operation on the flash memory based on the soft information.

Embodiments in the present disclosure have at least the following advantages and benefits.

First, embodiments in the present disclosure can provide useful techniques for obtaining higher endurance and better resilience to retention and read-disturb stresses. According to certain aspects, embodiments in the present disclosure can obtain higher endurance and higher average read performance for NAND flash devices by extending the decoding capabilities to a wide span of stress conditions by online adaptation of soft information to actual stress realization. According to certain aspects, embodiments in the present disclosure can cope with any NAND stress condition, which is expected to dynamically change over time or temperature, and thus enables a soft decoder to receive highly adapted LLR mapping for soft decoding. According to certain aspects, embodiments in the present disclosure can correct higher bit error rate (BER) with soft decoding.

Second, embodiments in the present disclosure can provide useful techniques for obtaining higher read performance (e.g., higher read throughput) with limited complexity. According to certain aspects, embodiments in the present disclosure can provide an uninformed (or blind or static) LLR estimator implemented on a NAND memory controller hardware and/or firmware, and/or host software, which lends itself to low complexity processing and thus allows for efficient hardware or firmware implementation. According to certain aspects, embodiments in the present disclosure can obtain high error correction capabilities for soft decoding with limited complexity. According to certain aspects, embodiments in the present disclosure can obtain high read throughput (or high decoding throughput) at a given implementation complexity.

FIG. 1 is a block diagram illustrating an example flash memory system 100 according to some embodiments, which can perform any of the methods described in the present disclosure.

The flash memory system 100 may include a flash memory module or flash memory device 104 and a memory controller 102. The flash memory module 104 may include multiple flash memory blocks 106, each of which includes multiple flash memory rows/pages (not shown). In some embodiments, each of the multiple flash memory rows/pages may have a plurality of cells. Additionally or alternatively, the module 104 can comprise or be implemented using a plurality of dies, each of the dies containing a plurality of the blocks 106.

The memory controller 102 may include a read circuit 110, a programming circuit (e.g. a program DSP) 120 and a programming parameter adapter 130. As shown in FIG. 1, the adapter 130 can adapt the programming parameters 122 used by programming circuit 120 as described above. The adapter 130 in this example may include a Program/Erase (P/E) cycle counter 132. Although shown separately for ease of illustration, some or all of the adapter 130 can be incorporated in the programming circuit 120. In some embodiments, the read circuit 110 may include a slope estimator 111, an ECC decoder 112 and/or a soft information generator 113. In some embodiments, the programming circuit 120 may include an ECC encoder 124. Embodiments of memory controller 102 can include additional or fewer components such as those shown in FIG. 1.

In some embodiments, a flash memory system (e.g., the flash memory system 100 in FIG. 1) may include a cell flash memory (e.g., the flash memory module 104 or a flash memory block 106 in FIG. 1) and a circuit (e.g., the read circuit 110 or the programming circuit 120 in FIG. 1) for performing operations of the plurality of cells. In some embodiments, the flash memory module 104 may have a plurality of cells. In some embodiments, each of the flash memory blocks 106 may have a plurality of cells. In some embodiments, the slope estimator 111 of the read circuit 110 may be configured to estimate slope information of a plurality of threshold voltage samples based on a read operation on the flash memory with a reference voltage. Embodiments of estimating slope information will be described below with reference to FIG. 3. In some embodiments, the soft information generator 113 of the read circuit 110 may be configured to generate soft information based on the estimated interference state and a read value from the first cell. Embodiments of generating soft information will be described below with reference to FIG. 3 and FIG. 4. The read circuit 110 may be configured to perform a read operation on the first cell and decode, via the ECC decoder 112, a result of the read operation on the first cell based on the soft information.

In some embodiments, the cell flash memory (e.g., the flash memory module 104 or a flash memory block 106 in FIG. 1) may include rows and columns of the plurality of cells. In some embodiments, a flash memory block 106 may include a plurality of pages (not shown) and a page may be defined as cells linked with the same word line, which correspond to a row of cells. In some embodiments, neighboring cells of a target cell are cells adjacent to the target cell. For example, each of a first neighboring cell and a second neighboring cell (of a first cell) may be positioned at the same column as a column of the first cell and at a row adjacent to a row of the first cell.

Figure 2:
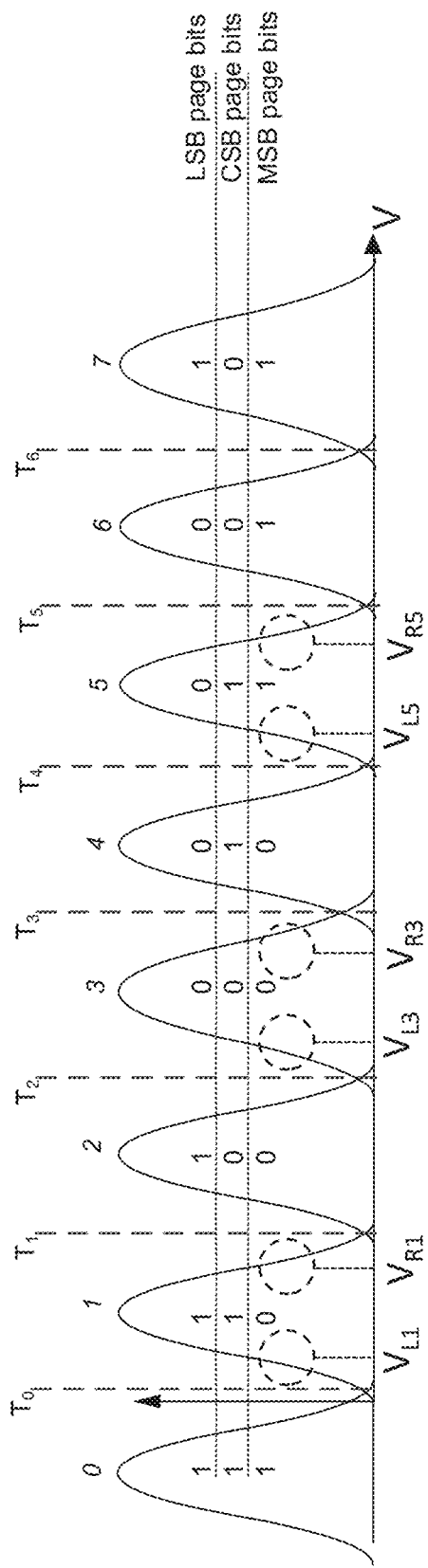
FIG. 2 illustrates threshold voltage distribution in a conventional three bits per cell (bpc) flash device.

FIG. 2 illustrates a superposition of the 8 possible voltage threshold distributions of a three bits per cell (bpc) flash memory device. The possible voltage threshold (VT) distributions of the cell have eight lobes, corresponding to the 8 different bit combinations of the three bits represented by the charge state of the cell. An MSB page read requires using reference voltages (or read thresholds) T0, T4, to separate the lobes into those with MSBs of 0 and those with MSBs of 1. For reading CSB pages the reference voltages T1, T3 and T5 are used. For reading LSB pages the reference voltages T2 and T6 have to be used. The lower (left) most distribution is known as the erase level.

Now, embodiments of estimating slope information and generating soft information will be described with reference to FIG. 3 and FIG. 4.

Figure 3:
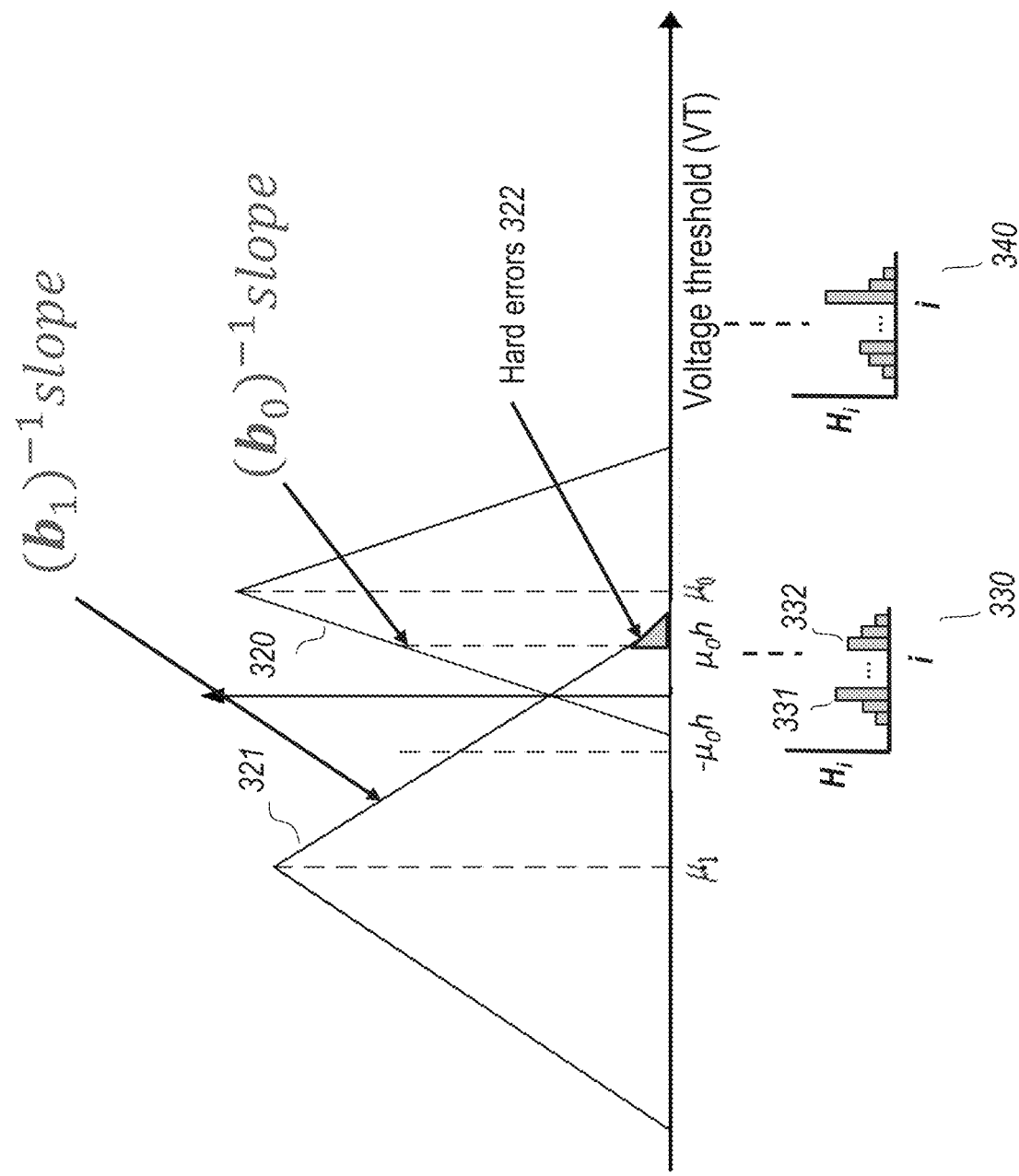
FIG. 3 illustrates an example aspect of voltage threshold distributions represented as a non-symmetric Laplace model according to some embodiments.

FIG. 3 illustrates an example aspect of voltage threshold distributions represented as a non-symmetric Laplace model according to some embodiments.

In some embodiments, a flash memory system (e.g., the slope estimator 111 of the flash memory system 100 in FIG. 1) may perform a robust approximation on a NAND voltage threshold (VT) distribution as a non-symmetric Laplace model. In some embodiments, conditional probability density functions (PDF) representing a non-symmetric Laplace model (or distribution) can be defined as follows:

$$f_0(x) = \frac{1}{2b_0} e^{-\frac{|x-\mu_0|}{b_0}}, f_1(x) = \frac{1}{2b_1} e^{-\frac{|x-\mu_1|}{b_1}}$$ (Equation 1)

where $f_0(x)$ are a PDF of information bit programmed to i=0, and $f_1(x)$ is a PDF of information bit programmed to i=1. Referring to FIG. 3, a VT distribution 320 corresponds to a probability distribution with PDF $f_0(x)$, and a VT distribution 321 corresponds to a probability distribution with PDF $f_1(x)$. As shown in FIG. 3, the VT distribution 320 has a slope of $(b_0)^{-1}$, and the VT distribution 321 has a slope of $(b_1)^{-1}$. FIG. 3 also illustrates hard errors 322 of the VT distributions with respect to read threshold $\mu_0 h$ (as shaded region on the right side of the read threshold $\mu_0 h$).

In some embodiments, the flash memory system may be configured to compute, from a given slope ratio (which is determined by stress conditions), the Laplace channel parameters. In some embodiments, a slope ratio r can be defined as $$r = \frac{b_0}{b_1},$$

and the error probability, assuming optimal read thresholds, can be given by $$P_e = \frac{1}{2} \cdot \left( e^{-\frac{|\mu_0|}{b_0}} + e^{-\frac{|\mu_1|}{b_1}} \right)$$ (Equation 2)

Since the PDFs are equal at the optimal read thresholds, i.e., $f_0(x=0)=f_1(x=0)$, the error probability can be expressed by $$P_e = \frac{(1+r)}{2 \cdot r} \cdot e^{-\frac{|\mu_0|}{b_0}}$$ (Equation 3)

In some embodiments, the flash memory system may compute a hard errors ratio $R_{HE}$ (defined below) according to the following steps. Assuming the read threshold is not optimal, e.g., $\mu_0 h$, a hard-error probability $P_{he}$ of having a hard-error with respect to the read threshold $\mu_0 h$, can be given by $$p_{he} = \frac{1}{2} \cdot \left( e^{-\frac{|\mu_0(1+h)|}{b_0}} + e^{-\frac{|\mu_1+\mu_0 h|}{b_1}} \right)$$ (Equation 4)

which can be simplified to $$p_{he} = \frac{1}{2} \cdot \left( W^{1+h} + \frac{1}{r} \cdot W^{1+rh} \right)$$ (Equation 5)

where $$W = e^{\frac{|\mu_0|}{b_0}},$$

and thus the hard errors ratio $R_{HE}$ can be defined as a ratio of the hard-error probability $P_{he}$ to the error probability $P_e$ as follows:

$$R_{HE} = \frac{P_{he}}{P_e} = \frac{r}{1+r} \cdot \left( W^h + \frac{1}{r} \cdot W^{rh} \right)$$ (Equation 6)

Referring to FIG. 3, it may be observed that the smaller the single-sided slope (e.g., the slope of $(b_1)^{-1}$ of the VT distribution 321), the higher is the hard errors ratio $R_{HE}$ (e.g., the size of the shaded portion 322 in FIG. 3).

In some embodiments, the flash memory system may perform soft sampling by obtaining read-outs from the NAND (e.g., the flash memory module 104 in FIG. 1) and store the read-outs into buffers to form a soft input. In some embodiments, the flash memory system may compute a histogram of VT samples (e.g., the histogram 330 in FIG. 3) around each read threshold (e.g., the read threshold $\mu_0 h$ in FIG. 3) using the read-outs from the NAND. In some embodiments, for triple-level cell (TLC) NAND devices, a page read may include multiple thresholds, and then the separation of cells for thresholds can be obtained by an additional read which maps VT samples into their groups corresponding respective thresholds. In some embodiments, from the histogram around each threshold (e.g., the histograms 330 and 340 in FIG. 3), the flash memory system may estimate slope information by computing approximated slopes (e.g., the slope of $(b_0)^{-1}$ and the slope of $(b_1)^{-1}$ in FIG. 3) and a slope ratio of the approximated slopes $$\left(\text{e.g., } r = \frac{b_0}{b_1}\right).$$

In some embodiments, from the slope ratio, the flash memory system may generate soft information by computing the amount of hard errors (e.g., hard-error probability $P_{he}$) and adapting or replacing LLRs (or LLR values) assigned to edge bins of the histogram (e.g., a bin at i=0 or 31 from 5-bit resolution sampling) according to the slope ratio. In some embodiments, the flash memory system may generate soft information using a table (e.g., a table 400 shown in FIG. 4) to map the slope ratio into a target LLR value assigned to edge bins.

In some embodiments, the flash memory system may begin the above process (e.g., estimating slope information and generating soft information) with (1) initializing LLRs to a Gaussian distribution as default mapping. In some embodiments, after soft sampling of VT samples, the flash memory system may (2) compute histograms for every group of VT samples corresponding to a respective threshold. In some embodiments, the flash memory system may (3) perform, from the histogram, a linear estimation on a subset of histogram samples to compute single sided slope estimation. In some embodiments, the flash memory system may (4) compute a slope ratio $r=\hat{a}_R/\hat{a}_L$, where $\hat{a}_R$ is an approximated slope of a right-side VT distribution (with respect to a threshold), and $\hat{a}_L$ is an approximated slope of a left-side VT distribution (with respect to the threshold). In some embodiments, the flash memory system may estimate hard errors from the slope ratio r. For example, the hard-error probability $P_{he}$ can be estimated from the slope ratio r using (Equation 5). In some embodiments, the flash memory system may compute a modified LLR value and replace a highest LLR value assigned to a histogram bin corresponding to a highest slope by the modified LLR value. In some embodiments, the flash memory system may (5) select the modified LLR value from a predefined table which maps the slope ratio to a modified LLR value. The above steps (1)-(5) can provide updated LLR values (denoted by $LLR_{est}$) to be used by a soft decoder (e.g., the ECC decoder 111 in FIG. 1). In some embodiments, steps (1)-(5) may be repeated for all read thresholds of a target page.

In some embodiments, in initializing LLR values in step (1), the flash memory system may initialize LLR values using side information from previous decoding results to refine the estimation of the initial LLR values. In some embodiments, the flash memory system may store empirical LLRs, denoted by $LLR_{prev,emp}$, which are obtained from the last page, as part of a controller history. In some embodiments, in response to reading another page on the same block and performing soft decoding, the flash memory system may augment the process of LLR estimation by an additional step as follows:

$$LLR_{est}=\alpha\cdot LLR_{est}+(1-\alpha)\cdot LLR_{prev,emp}. \quad \text{(Equation 7)}$$

In some embodiments, the weight of $\alpha$ may depend on a relevance of the historical empirical LLRs for the current decoding operation. For example, if the values of the historical empirical LLRs originated from a row physically correlated with the current row and were recently obtained, then $\alpha$ can be small so as to give a high weight to the empirical LLRs.

Now, an exemplary implementation of estimating slope information and soft information (e.g., LLRs) from 5-bit resolution sampling, with group information will be described. In some embodiments, the flash memory system may set an initial state of default LLR mapping $\{L_i\}$ where bin index i=0, . . . , 31, as follows:

$$\{L_i\}=\{-16,-15,\ldots,-1,1,2,\ldots,15,16\} \quad \text{(Equation 8)}$$

The flash memory system may calculate histogram $\{H_i\}$ which denotes the number of samples assigned to $i^{th}$ bin of the histogram (see FIG. 3). For example, a histogram bin may represent the number of samples for which the cells' state changes between the corresponding two read thresholds. In some embodiments, in calculating the histogram $\{H_i\}$, no error vector nor empirical LLRs may be used. In some embodiments, only the high weight histogram bins (e.g., bins having at least a predefined number of samples) may be taken and used for each slope estimation. For example, subset indices for estimating a left slope may be $ind_L=\{6,7,\ldots,11\}$, and subset indices for estimating a right slope may be $ind_R=\{20,21,\ldots,25\}$.

In some embodiments, assuming the total number of samples is 1000, the flash memory system may perform an exemplary fixed point coefficient computation for slopes estimated using $x_i$, $y_{i,L}$, and $y_{i,R}$ as follows:

$$x_i = \begin{cases} i-16, & i=0,\ldots,15 \\ i-15, & i=16,\ldots,31 \end{cases}, \quad \text{(Equation 8)}$$

$$y_{i,L} = \left\lfloor \frac{-H_i \cdot x_i \cdot x_{ind_L(end)} \cdot 1000}{H_{ind_L(end)}} \right\rfloor = \left\lfloor \frac{-H_i \cdot x_i \cdot x_{11} \cdot 1000}{H_{11}} \right\rfloor, \quad \text{(Equation 9)}$$

$$y_{i,R} = \left\lfloor \frac{H_i \cdot x_i \cdot x_{ind_R(1)} \cdot 1000}{H_{ind_R(1)}} \right\rfloor = \left\lfloor \frac{H_i \cdot x_i \cdot x_{20} \cdot 1000}{H_{20}} \right\rfloor. \quad \text{(Equation 10)}$$

In some embodiments, the flash memory system may compute a slope ratio $r=\hat{a}_R/\hat{a}_L$, where $\hat{a}_R$ is an approximated slope of a right-side VT distribution (with respect to a threshold), and $\hat{a}_L$ is an approximated slope of a left-side VT distribution (with respect to the threshold). For example, $\hat{a}_R$ and $\hat{a}_L$ can be calculated using the following equation:

$$\hat{a}_L = \frac{\sum_{i=6}^{i=11} y_{i,L}}{\sum_{i=6}^{i=11} x_i^2}, \quad \hat{a}_R = \frac{\sum_{i=20}^{i=25} y_{i,R}}{\sum_{i=20}^{i=25} x_i^2}, \quad \text{(Equation 11)}$$

In some embodiments, $â_R$ and $â_L$ can be limited to a maximum value for robustness. For example, $â_R$=max(700, $â_R$), and $â_L$=max(700, $â_L$).

In some embodiments, the flash memory system may compute the slope ratio r as follows:

$$r = \begin{cases} \left\lfloor \left| \frac{â_L \cdot 1000}{â_R} \right| \right\rfloor, & â_L > â_R \\ \left\lfloor \left| \frac{â_R \cdot 1000}{â_L} \right| \right\rfloor, & \text{else} \end{cases} \quad \text{(Equation 12)}$$

Now, an exemplary implementation of generating (or estimating) soft information (e.g., LLRs) based on the scope ratio r will be described with reference to FIG. 4.

FIG. 4 is a table illustrating an example aspect of mapping of a slopes ratio into an LLR value using example methodologies according to some embodiments. In some embodiments, the flash memory system may assign, from the estimated slope ratio (e.g., the slope ratio r), a new mapping to an edge LLR (e.g., an LLR value at bin index i=0 or 31 from 5-bit resolution sampling) as a modified hard-errors LLR value according to a predefined table (e.g., the table 400 in FIG. 4). In some embodiments, referring to FIG. 4, the flash memory system may select a modified hard-errors LLR value, denoted by $L_{HE}$, from the table 400 according to the slopes ratio r. For example, if r=2019, the flash memory system may determine the modified hard-errors LLR value $L_{HE}$ to be 9 according to the table 400. If r=1019, the flash memory system may determine the modified hard-errors LLR value $L_{HE}$ to be 0 (the default value) according to the table 400.

In some embodiments, the flash memory system may calculate an estimated LLR value (denoted by $\hat{L}_i$) using the modified hard-errors LLR value $L_{HE}$, as follows:

$$\hat{L}_i = \begin{cases} S_{HE} \cdot L_{HE}, & \text{for } i = I_{HE} \text{ if } L_{HE} > 0 \\ L_i, & \text{else} \end{cases} \quad \text{(Equation 13)}$$

where hard-error index $$I_{HE} = \begin{cases} 0, & â_L > â_R \\ 31, & \text{else} \end{cases},$$

with sign $$S_{HE} = \begin{cases} -1, & â_L > â_R \\ 1, & \text{else} \end{cases}.$$

That is, the flash memory system may perform an LLR estimation by replacing an edge LLR (e.g., an LLR value at bin index i=0 or 31 from 5-bit resolution sampling) by the modified hard-errors LLR value $L_{HE}$ which has been obtained from a predefined table (e.g., table 400 in FIG. 4) based on a calculated slope ratio r. In some embodiments, the flash memory system may perform such LLR estimation for each part of a codeword around its corresponding threshold, which is determined by an additional separation read (or additional separation reads).

In some embodiments, the bins for which hard errors are estimated are not necessarily for i=0 and 31. For example, the bins for which hard errors are estimated may be any bins with high (or highest) amount of labels of same value (e.g., high or highest number of samples assigned to the bin). Usually these bins are edge bins, but the embodiments of the present disclosure are not limited thereto. That is, in some embodiments, the bins for which hard errors are estimated may be non-edge bins, for example, if there is a re-centering operations due to sign change.

In some embodiments, a hard decision (e.g., a hard error) may be estimated and sign values of LLRs may be modified based on the estimated hard decision. In some embodiments, a hard decision of a soft input may be estimated from a slope ratio, and LLR values may be reassigned by assigning modified sign values according to estimation results.

In some embodiments, in response to an LLR estimation of a group of samples (e.g., the group of samples in the histogram 330 in FIG. 3), the flash memory system may perform a re-labeling operation before proceeding to an LLR estimation of the next group of samples (e.g., the group of samples in the histogram 340 in FIG. 3). In some embodiments, the flash memory system may perform the re-labeling by changing the label of the edge bin (e.g., the number of samples assigned to the edge bin) for which LLR mapping has been changed, such that its label would map to the estimated LLR.

Systems and methods for estimating slope information and soft information (e.g., LLR values) according to some embodiments can be used for implementation in client/data center/enterprise solid state drive (SSD) controllers, universal flash storage (UFS)/secure digital (SD) controllers, or storage using multi-level cell memory devices (including, but not limited to, NAND devices). In some embodiments, an ECC decoder (e.g., the ECC decoder 112) may use not only LLRs but also use other codes including, but not limited to, Low-Density Parity-Check (LDPC), Turbo, etc.

In some embodiments, a flash memory system (e.g., the flash memory system 100 in FIG. 1) may include a flash memory (e.g., the flash memory module 104 in FIG. 1) and a circuit for performing operations of the flash memory (e.g., the memory controller 102 in FIG. 1). The circuit (e.g., the slope estimator 111 in FIG. 1) may be configured to estimate slope information (e.g., the slope of $(b_0)^{-1}$, the slope of $(b_1)^{-1}$, the slope ratio r) of a plurality of threshold voltage samples (e.g., VT samples used for computing the histograms 330 and 340 in FIG. 3) based on a first read operation on the flash memory with a first reference voltage (e.g., the read threshold $\mu_0 h$ in FIG. 3). The circuit may be further configured to generate soft information (e.g., updated LLR values $LLR_{est}$, LLR mapping $\{L_i\}$, modified hard-errors LLR values $L_{HE}$, estimated LLR value $\hat{L}_i$) based on the estimated slope information (e.g., the slope ratio r). The circuit (e.g., the ECC decoder 112 in FIG. 1) may be further configured to decode a result of a second read operation on the flash memory based on the soft information. For example, a decoder (e.g., the ECC decoder 112 in FIG. 1) may decode a read result of a cell in the flash memory with the generated soft information (e.g., estimated LLR values $\hat{L}_i$).

In some embodiments, in estimating slope information, the circuit may be configured to estimate first slope information (e.g., an approximated slope $â_R$ of a right-side VT distribution) and second slope information (e.g., an approximated slope $â_L$ of a left-side VT distribution), and estimate a slope ratio (e.g., a slope ratio $r=\hat{a}_R/\hat{a}_L$) as the slope information based on the first slope information and the second slope information.

In some embodiments, in generating the soft information, the circuit may be configured to generate log-likelihood ratio (LLR) values as the soft information (e.g., modified hard-errors LLR values $L_{HE}$) based on the slope ratio (e.g., the slope ratio r). In generating the soft information, the circuit may be further configured to map the slope ratio to estimated LLR values of hard errors (e.g., modified hard-errors LLR values $L_{HE}$), and generate the LLR values as the soft information (e.g., estimated LLR values $\hat{L}_i$) based on the estimated LLR values of hard errors (e.g., modified hard-errors LLR values $L_{HE}$).

In some embodiments, a plurality of ranges of the slope ratio may be mapped to respective LLR values of hard errors. For example, referring to FIG. 4, a range of r>2400 and a range of 2200<r≤2400 are mapped to LLR values "7" and "8", respectively.

In some embodiments, the slope ratio may be mapped to the estimated LLR values of hard errors using a predefined table (e.g., the table 400 in FIG. 4).

In some embodiments, in estimating the slope information, the circuit may be configured to generate a histogram of the plurality of threshold voltage samples having a plurality of bins (e.g., the histogram 330 having bins 331, 332 in FIG. 3), estimate first slope information based on left side bins of the histogram (e.g., bins with $ind_L=\{6,7,\ldots,11\}$ in Equation 9) with respect to the first reference voltage, and estimate second slope information based on right side bins of the histogram (e.g., bins with $ind_R=\{20,21,\ldots,25\}$ in Equation 10) with respect to the first reference voltage. The first slope information and the second slope information may be estimated based on a subset of the plurality of bins of the histogram (e.g., $ind_L=\{6,7,\ldots,11\}$ and $ind_R=\{20,21,\ldots,25\}$ are subsets of $\{0,1,\ldots,31\}$).

In some embodiments, in generating the soft information, the circuit may be configured to initialize a plurality of log-likelihood ratio (LLR) values based on a Gaussian distribution, and modify the plurality of LLR values based on the slope ratio. In modifying the plurality of LLR values based on the slope ratio, the circuit may be configured to modify, based on the slope ratio (e.g., the slope ratio r), one of the plurality of LLR values corresponding to a left-most bin or a right-most bin of the plurality of bins (e.g., an LLR value at bin index i=0 or 31 from 5-bit resolution sampling).

Figure 5:
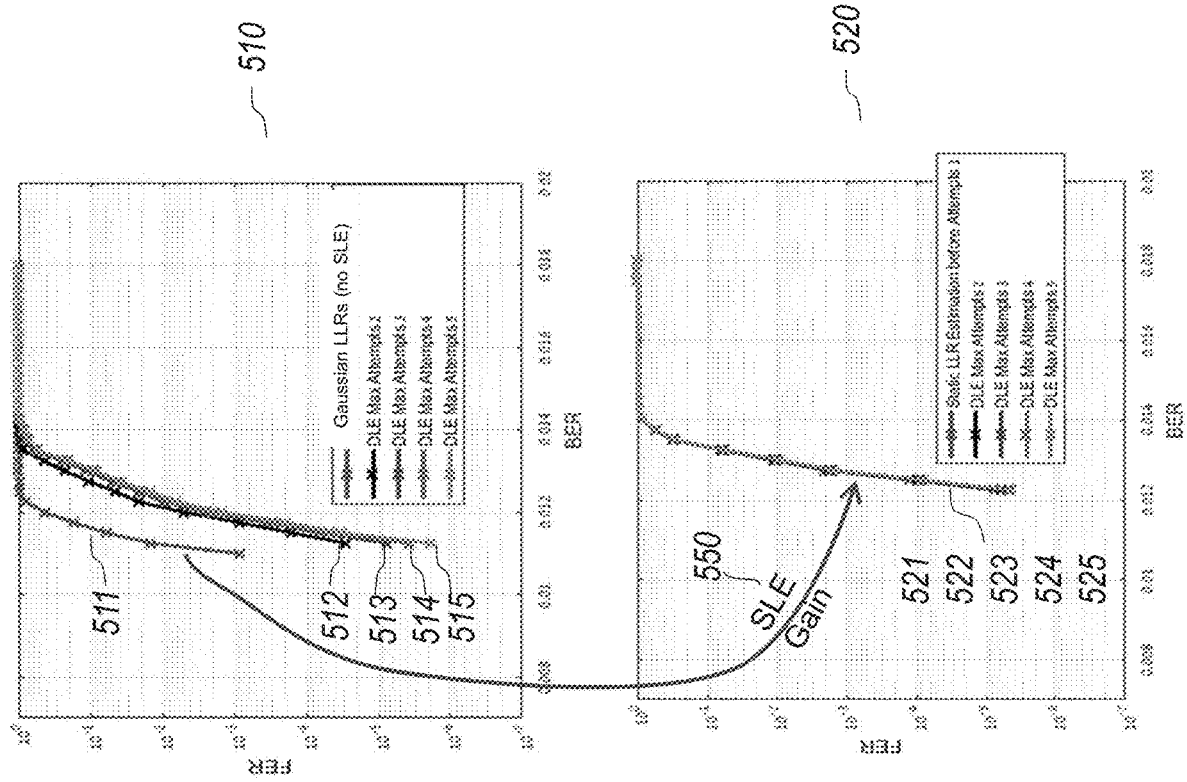
FIG. 5 is a diagram illustrating an example result of comparing a performance gain obtained with a conventional method with a performance gain obtained with a log-likelihood ratio (LLR) estimation according to some embodiments.

FIG. 5 is a diagram illustrating an example result of comparing a performance gain obtained with a conventional method with a performance gain obtained with a log-likelihood ratio (LLR) estimation according to some embodiments. The x-axis in FIG. 5 is a fixed bit error rate (BER) used in a hard-read decoding, and the y-axis is a corresponding frame error rate (FER).

FIG. 5 demonstrates the performance improvement that can be achieved with a static LLR estimation (SLE) as described above with reference to FIG. 3 and FIG. 4. It is demonstrated as frame error rate (FER) as function of BER for soft decoding. On the upper FIG. 510, there are multiple curves 511, 512, 513, 514, 515, among which the curve 511 corresponds to the case where default LLRs (e.g., $\{L_i\}=\{-16,-15,\ldots,-1,1,2,\ldots,15,16\}$ in Equation 8) are used without being replaced with a modified hard-errors LLR value (e.g., $L_{HE}$). The other curves 512, 513, 514, 515 are obtained by dynamic LLR estimation (DLE) between attempts using an error vector from the decoder (e.g., the ECC decoder 112 in FIG. 1).

On the lower FIG. 520, there are multiple curves 521, 522, 523, 524, 525 all of which use the static LLR estimation (SLE) as described above with reference to FIG. 3 and FIG. 4. Among the curves 521, 522, 523, 524, 525, the curve 521 corresponds to the same case as the curve 511 except for LLRs are replaced with a modified hard-errors LLR value (e.g., $L_{HE}$). It is observed that due to the static LLR estimation, the curve 521 nearly matches the LLR mapping to optimal LLRs. This translates to a performance gain 550 from the curve 511, as the success probability is improved on the first decoding attempt. It is also observed that additional attempts with dynamic LLR estimation in the curves 522, 523, 524, 525 have no much additional contribution.

Figure 6:
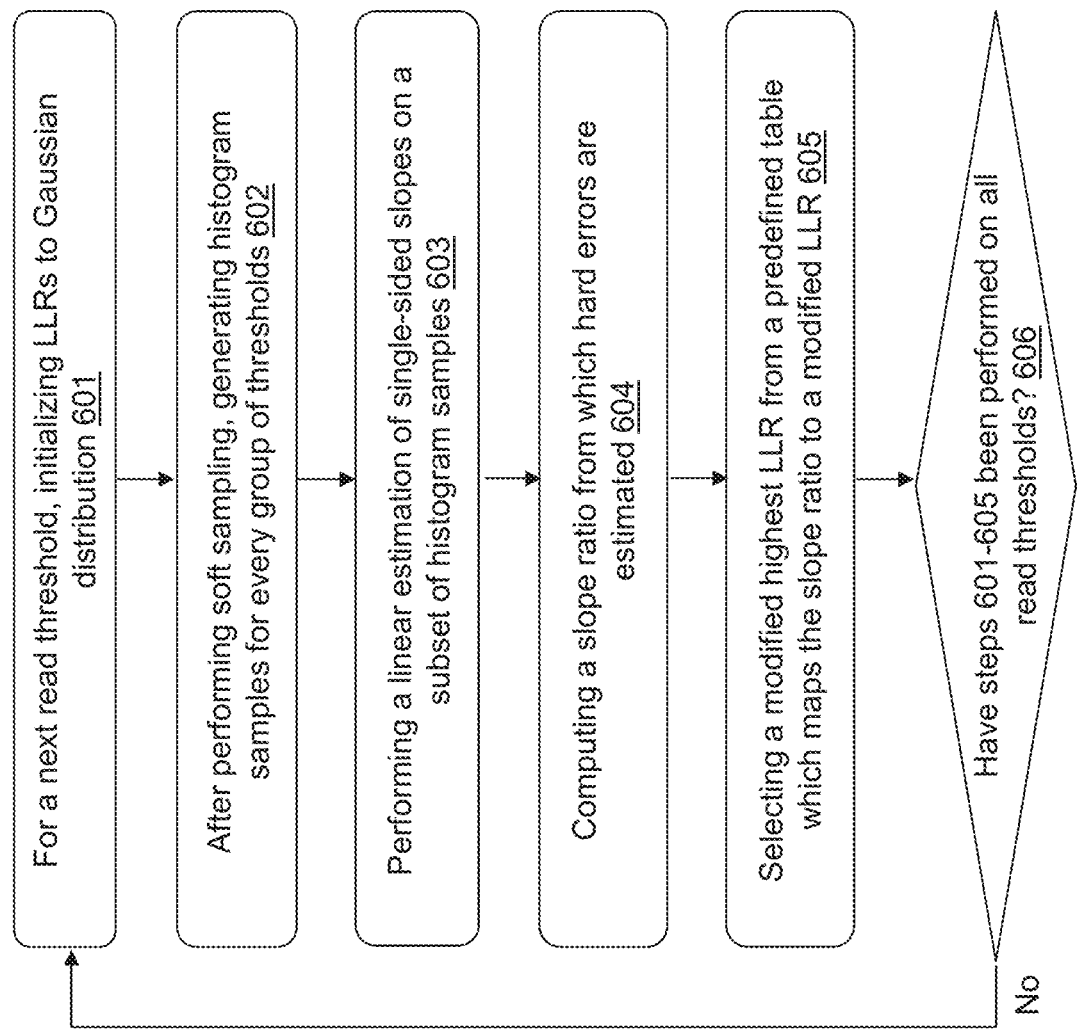
FIG. 6 is a flowchart illustrating an example methodology for generating log-likelihood ratio (LLR) values as soft information based on the slope ratio.

FIG. 6 is an example methodology for generating log-likelihood ratio (LLR) values as soft information based on the slope ratio according to some embodiments. In some embodiments, the generated LLR values (e.g., updated $LLR_{est}$) may be used by a soft decoder (e.g., the ECC decoder 112 in FIG. 1).

In this example, the process begins in step S601 by initializing LLRs to Gaussian distribution as default mapping for a read threshold. In some embodiments, soft sampling may be performed by obtaining read-outs from the NAND (e.g., the flash memory module 104 in FIG. 1) and store the read-outs into buffers to form a soft input.

In step S602, in some embodiments, after soft sampling of VT samples, a histogram (e.g., the histogram 330 in FIG. 3) may be computed for every group of VT samples corresponding to a respective threshold (e.g., read threshold $\mu_0 h$ in FIG. 3).

In step S603, in some embodiments, from the histogram, a linear estimation may be performed on a subset of histogram samples (e.g., bins with $ind_L=\{6,7,\ldots,11\}$ in Equation 9 or bins with $ind_R=\{20,21,\ldots,25\}$ in Equation 10) to compute single sided slopes estimation. For example, an approximated slope $\hat{a}_R$ of a right-side VT distribution with respect to a threshold, and an approximated slope $\hat{a}_L$ of a left-side VT distribution with respect to the threshold may be calculated using a linear estimation (e.g., using Equation 11).

In step S604, in some embodiments, a slope ratio may be computed from which hard errors are estimated. For example, a slope ratio $r=\hat{a}_R/\hat{a}_L$ may be computed, from which the hard errors are estimated (e.g., using Equation 6). In some embodiments, a modified LLR value (e.g., modified hard-errors LLR values $L_{HE}$) may be computed to replace a highest LLR value assigned to a histogram bin corresponding to a highest slope (e.g., a bin at i=0 or 31 from 5-bit resolution sampling) by the modified LLR value.

In step S605, in some embodiments, the modified LLR value (e.g., modified hard-errors LLR values $L_{HE}$) may be selected from a predefined table which maps the slope ratio to a modified LLR value (e.g., the table 400 in FIG. 4).

In step S606, in some embodiments, it may be checked whether the above-noted steps 601-605 have been performed on all read thresholds of a target page. In response to determination that the above-noted steps 601-605 have not been performed on all read thresholds of the target page, the process may proceed to the step 601 so that the steps 601-605 may be repeated for all read thresholds of the target page.

Figure 7:
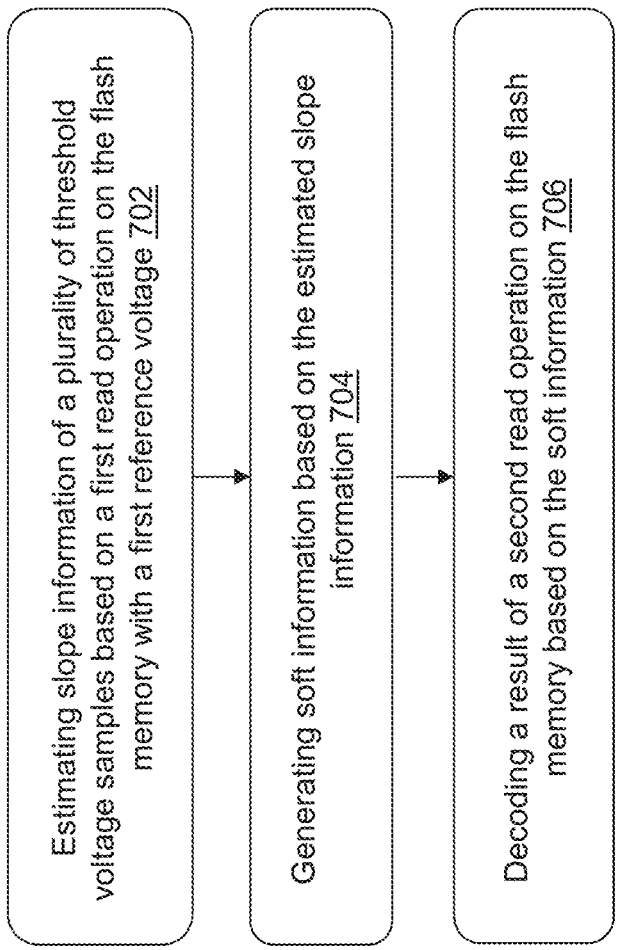
FIG. 7 is a flowchart illustrating an example methodology for decoding a result of a read operation on a flash memory based on estimated slope information of threshold voltage samples according to some embodiments.

FIG. 7 is a flowchart illustrating an example methodology for decoding a result of a read operation on a flash memory based on estimated slope information of threshold voltage samples according to some embodiments.

In this example, the process begins in step S702 by estimating slope information (e.g., the slope of $(b_0)^{-1}$, the slope of $(b_1)^{-1}$, the slope ratio r) of a plurality of threshold voltage samples (e.g., VT samples used for computing the histograms 330 and 340 in FIG. 3) based on a first read operation on the flash memory (e.g., the flash memory module 104 in FIG. 1) with a first reference voltage (e.g., the read threshold $\mu_0 h$ in FIG. 3).

In some embodiments, in estimating slope information, first slope information (e.g., an approximated slope $\hat{a}_R$ of a right-side VT distribution) and second slope information (e.g., an approximated slope $\hat{a}_L$ of a left-side VT distribution) may be estimated, and a slope ratio (e.g., a slope ratio $r=\hat{a}_R/\hat{a}_L$) may be estimated as the slope information based on the first slope information and the second slope information.

In some embodiments, in estimating the slope information, a histogram of the plurality of threshold voltage samples having a plurality of bins (e.g., the histogram 330 having bins 331, 332 in FIG. 3) may be generated. First slope information may be estimated based on left side bins of the histogram (e.g., bins with $\text{ind}_L=\{6,7,\ldots,11\}$ in Equation 9) with respect to the first reference voltage. Second slope information may be estimated based on right side bins of the histogram (e.g., bins with $\text{ind}_R=\{20,21,\ldots,25\}$ in Equation 10) with respect to the first reference voltage. The first slope information and the second slope information may be estimated based on a subset of the plurality of bins of the histogram (e.g., $\text{ind}_L=\{6,7,\ldots,11\}$ and $\text{ind}_R=\{20,21,\ldots,25\}$ are subsets of $\{0,1,\ldots,31\}$).

In step 704, in some embodiments, soft information (e.g., updated LLR values $\text{LLR}_{est}$, LLR mapping $\{L_i\}$, modified hard-errors LLR values $L_{HE}$, estimated LLR value $\hat{L}_i$) may be generated based on the estimated slope information (e.g., the slope ratio r). In generating the soft information, log-likelihood ratio (LLR) values (e.g., modified hard-errors LLR values $L_{HE}$) may be generated as the soft information based on the slope ratio (e.g., the slope ratio r).

In some embodiments, in generating the soft information, the slope ratio (e.g., the slope ratio r) may be mapped to estimated LLR values of hard errors (e.g., modified hard-errors LLR values $L_{HE}$), and the LLR values (e.g., estimated LLR values $L_i$) may be generated as the soft information based on the estimated LLR values of hard errors (e.g., modified hard-errors LLR values $L_{HE}$). In some embodiments, a plurality of ranges of the slope ratio may be mapped to respective LLR values of hard errors. For example, referring to FIG. 4, a range of r>2400 and a range of $2200<r\leq2400$ are mapped to LLR values "7" and "8", respectively. The slope ratio may be mapped to the estimated LLR values of hard errors using a predefined table (e.g., the table 400 in FIG. 4).

In some embodiments, in generating the soft information, a plurality of log-likelihood ratio (LLR) values may be initialized based on a Gaussian distribution, and the plurality of LLR values may be modified based on the slope ratio (e.g., the slope ratio r). In modifying the plurality of LLR values based on the slope ratio, one of the plurality of LLR values corresponding to a left-most bin or a right-most bin of the plurality of bins (e.g., an LLR value at bin index $1=0$ or 31 from 5-bit resolution sampling) may be modified based on the slope ratio.

In step S706, in some embodiments, a result of a second read operation on the flash memory may be decoded based on the soft information. For example, a decoder (e.g., the ECC decoder 112 in FIG. 1) may decode a read result of a cell in the flash memory with the soft information generated in step S704 (e.g., estimated LLR values $\hat{L}_i$).

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. All structural and functional equivalents to the elements of the various aspects described throughout the previous description that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed as a means plus function unless the element is expressly recited using the phrase "means for."

It is understood that the specific order or hierarchy of steps in the processes disclosed is an example of illustrative approaches. Based upon design preferences, it is understood that the specific order or hierarchy of steps in the processes may be rearranged while remaining within the scope of the previous description. The accompanying method claims present elements of the various steps in a sample order, and are not meant to be limited to the specific order or hierarchy presented.

The previous description of the disclosed implementations is provided to enable any person skilled in the art to make or use the disclosed subject matter. Various modifications to these implementations will be readily apparent to those skilled in the art, and the generic principles defined herein may be applied to other implementations without departing from the spirit or scope of the previous description. Thus, the previous description is not intended to be limited to the implementations shown herein but is to be accorded the widest scope consistent with the principles and novel features disclosed herein.

The various examples illustrated and described are provided merely as examples to illustrate various features of the claims. However, features shown and described with respect to any given example are not necessarily limited to the associated example and may be used or combined with other examples that are shown and described. Further, the claims are not intended to be limited by any one example.

The foregoing method descriptions and the process flow diagrams are provided merely as illustrative examples and are not intended to require or imply that the steps of various examples must be performed in the order presented. As will be appreciated by one of skill in the art the order of steps in the foregoing examples may be performed in any order. Words such as "thereafter," "then," "next," etc. are not intended to limit the order of the steps; these words are simply used to guide the reader through the description of the methods. Further, any reference to claim elements in the singular, for example, using the articles "a," "an" or "the" is not to be construed as limiting the element to the singular.

The various illustrative logical blocks, modules, circuits, and algorithm steps described in connection with the examples disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The hardware used to implement the various illustrative logics, logical blocks, modules, and circuits described in connection with the examples disclosed herein may be implemented or performed with a general purpose processor, a DSP, an ASIC, an FPGA or other programmable logic device, discrete gate or transistor logic, discrete hardware components, or any combination thereof designed to perform the functions described herein. A general-purpose processor may be a microprocessor, but, in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration. Alternatively, some steps or methods may be performed by circuitry that is specific to a given function.

In some exemplary examples, the functions described may be implemented in hardware, software, firmware, or any combination thereof. If implemented in software, the functions may be stored as one or more instructions or code on a non-transitory computer-readable storage medium or non-transitory processor-readable storage medium. The steps of a method or algorithm disclosed herein may be embodied in a processor-executable software module which may reside on a non-transitory computer-readable or processor-readable storage medium. Non-transitory computer-readable or processor-readable storage media may be any storage media that may be accessed by a computer or a processor. By way of example but not limitation, such non-transitory computer-readable or processor-readable storage media may include RAM, ROM, EEPROM, FLASH memory, CD-ROM or other optical disk storage, magnetic disk storage or other magnetic storage devices, or any other medium that may be used to store desired program code in the form of instructions or data structures and that may be accessed by a computer. Disk and disc, as used herein, includes compact disc (CD), laser disc, optical disc, digital versatile disc (DVD), floppy disk, and blu-ray disc where disks usually reproduce data magnetically, while discs reproduce data optically with lasers. Combinations of the above are also included within the scope of non-transitory computer-readable and processor-readable media. Additionally, the operations of a method or algorithm may reside as one or any combination or set of codes and/or instructions on a non-transitory processor-readable storage medium and/or computer-readable storage medium, which may be incorporated into a computer program product.

The preceding description of the disclosed examples is provided to enable any person skilled in the art to make or use the present disclosure. Various modifications to these examples will be readily apparent to those skilled in the art, and the generic principles defined herein may be applied to some examples without departing from the spirit or scope of the disclosure. Thus, the present disclosure is not intended to be limited to the examples shown herein but is to be accorded the widest scope consistent with the following claims and the principles and novel features disclosed herein.

What is claimed is:

1. A method for operating a flash memory using a decoder, the method comprising:
   estimating slope information using a plurality of threshold voltage samples obtained by performing a soft sampling on the flash memory, the soft sampling including a plurality of reads using a plurality of thresholds with respect to a reference voltage, the soft sampling providing an indication of a current stress condition of the flash memory;
   generating soft information for use by the decoder based on the estimated slope information; and
   decoding, by the decoder, a result of a read operation on the flash memory based on the soft information that was generated based on the estimated slope information.

2. The method of claim 1, wherein estimating slope information comprises:
   estimating first slope information and second slope information, and
   estimating a slope ratio as the slope information based on the first slope information and the second slope information.

3. The method of claim 2, wherein generating the soft information further comprises:
   generating log-likelihood ratio (LLR) values as the soft information based on the slope ratio.

4. The method of claim 3, wherein generating the soft information further comprises:
   mapping the slope ratio to estimated LLR values of hard errors; and
   generating the LLR values as the soft information based on the estimated LLR values of hard errors.

5. The method of claim 4, wherein a plurality of ranges of the slope ratio are mapped to respective LLR values of hard errors.

6. The method of claim 4, wherein the slope ratio is mapped to the estimated LLR values of hard errors using a predefined table.

7. The method of claim 2, wherein estimating the slope information further comprises:
   generating a histogram of the plurality of threshold voltage samples having a plurality of bins;
   estimating the first slope information based on a first set of the plurality of bins of the histogram, the first set of the plurality of bins having a first voltage relationship with respect to the reference voltage; and
   estimating the second slope information based on a second set of the plurality of bins of the histogram, the second set of the plurality of bins having a second different voltage relationship with respect to the reference voltage.

8. The method of claim 7, wherein the first set and the second set together comprise a subset of the plurality of bins of the histogram.

9. The method of claim 7, wherein generating the soft information comprises:
   initializing a plurality of log-likelihood ratio (LLR) values based on a Gaussian distribution; and
   modifying the plurality of LLR values based on the slope ratio.

10. The method of claim 9, wherein modifying the plurality of LLR values based on the slope ratio comprises:

modifying, based on the slope ratio, one of the plurality of LLR values corresponding to a predetermined one of the first or second sets of the plurality of bins.

11. A flash memory system comprising:
a flash memory; and
a circuit having a decoder for performing operations of the flash memory, the circuit being configured to:
estimate slope information using a plurality of threshold voltage samples obtained by performing a soft sampling on the flash memory, the soft sampling including a plurality of reads using a plurality of thresholds with respect to a reference voltage, the soft sampling providing an indication of a current stress condition of the flash memory;
generate soft information for use by the decoder based on the estimated slope information; and
decode, by the decoder, a result of a read operation on the flash memory based on the soft information that was generated based on the estimated slope information.

12. The flash memory system of claim 11, wherein in estimating slope information, the circuit is further configured to:
estimate first slope information and second slope information, and
estimate a slope ratio as the slope information based on the first slope information and the second slope information.

13. The flash memory system of claim 12, wherein in generating the soft information, the circuit is further configured to:
generate log-likelihood ratio (LLR) values as the soft information based on the slope ratio.

14. The flash memory system of claim 13, wherein in generating the soft information, the circuit is further configured to:
map the slope ratio to estimated LLR values of hard errors; and
generate the LLR values as the soft information based on the estimated LLR values of hard errors.

15. The flash memory system of claim 14, the circuit is further configured to map a plurality of ranges of the slope ratio to respective LLR values of hard errors.

16. The flash memory system of claim 14, wherein the slope ratio is mapped to the estimated LLR values of hard errors using a predefined table.

17. The flash memory system of claim 12, wherein in estimating the slope information, the circuit is further configured to:
generate a histogram of the plurality of threshold voltage samples having a plurality of bins;
estimate the first slope information based on a first set of the plurality of bins of the histogram, the first set of the plurality of bins having a first voltage relationship with respect to the reference voltage; and
estimate the second slope information based on a second set of the plurality of bins of the histogram, the second set of the plurality of bins having a second different voltage relationship with respect to the reference voltage.

18. The flash memory system of claim 17, wherein the first set and the second set together comprise a subset of the plurality of bins of the histogram.

19. The flash memory system of claim 17, wherein in generating the soft information, the circuit is further configured to:
initialize a plurality of log-likelihood ratio (LLR) values based on a Gaussian distribution; and
modify the plurality of LLR values based on the slope ratio.

20. The flash memory system of claim 19, wherein in modifying the plurality of LLR values based on the slope ratio, the circuit is further configured to:
modify, based on the slope ratio, one of the plurality of LLR values corresponding to a predetermined one of the first or second sets of the plurality of bins.

* * * * *